United States Patent
Hergenrother et al.

(10) Patent No.: US 7,374,998 B2
(45) Date of Patent: May 20, 2008

(54) SELECTIVE INCORPORATION OF CHARGE FOR TRANSISTOR CHANNELS

(75) Inventors: John Michael Hergenrother, Ridgefield, CT (US); Zhibin Ren, Hopewell Junction, NY (US); Dinkar Virendra Singh, White Plains, NY (US); Jeffrey William Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 11/346,662

(22) Filed: Feb. 3, 2006

(65) Prior Publication Data

US 2007/0184619 A1 Aug. 9, 2007

(51) Int. Cl.
*H01L 21/336* (2006.01)

(52) U.S. Cl. ............... 438/287; 438/199; 438/216; 438/240; 438/259; 438/263; 438/264; 438/283; 438/286; 257/E21.202

(58) Field of Classification Search ............... 438/216, 438/263, 283, 286, 291, 294
See application file for complete search history.

(56) References Cited

U.S. PATENT DOCUMENTS

2002/0094643 A1* 7/2002 Solomon et al. ............ 438/279

* cited by examiner

*Primary Examiner*—Michael S. Lebentritt
*Assistant Examiner*—Kyoung Lee
(74) *Attorney, Agent, or Firm*—Keusey, Tutunjian & Bitetto, P.C.

(57) ABSTRACT

A device and method for selective placement of charge into a gate stack includes forming gate stacks including a gate dielectric adjacent to a transistor channel and a gate conductor and forming doped regions for transistor operation. A layer rich in a passivating element is deposited over the doped regions and the gate stack, and the layer rich the passivating element is removed from selected transistors. The layer rich in the passivating element is than annealed to drive-in the passivating element to increase a concentration of charge at or near transistor channels on transistors where the layer rich in the passivating element is present. The layer rich in the passivating element is removed.

16 Claims, 2 Drawing Sheets

SELECTIVE INCORPORATION OF CHARGE FOR TRANSISTOR CHANNELS

BACKGROUND

1. Technical Field

The present invention relates to semiconductor devices, and more particularly to a device and method for enhancing performance in complementary metal oxide semiconductor (CMOS) technology.

2. Description of the Related Art

Metal-gate high dielectric constant (hi-K) and poly-silicon fully silicided (FUSI) gate electrode stack field effect transistors (FETs) are attracting substantial interest for continued complementary metal oxide semiconductor (CMOS) scaling. One major problem to date with both techniques is the ability to set a proper threshold voltage (Vt) for the NFET device without greatly lowering the active channel doping concentration.

This effect is dependant upon the position of the Fermi level in a metal hi-K or FUSI gate stack, which tends to be mid-gap versus in a conventional poly-silicon gate electrode, where the Fermi level resides at the band gap edge. Eliminating or lowering the channel doping will greatly worsen the short-channel control in the device.

Also, a technique which is not selective will in general move one FET Vt in the right direction (i.e., NFET), but will move the other FET Vt in the wrong direction (i.e., PFET). Dual-metal integration schemes have been proposed, but these are more challenging from a process integration standpoint than conventional CMOS.

SUMMARY

A device and method for selective placement of charge into a gate stack includes forming gate stacks including a gate dielectric adjacent to a transistor channel and a gate conductor and forming doped regions for transistor operation. A layer rich in a passivating element is deposited over the doped regions and the gate stack, and the layer rich the passivating element is removed from selected transistors. The layer rich in the passivating element is than annealed to drive-in the passivating element to increase a concentration of charge at or near transistor channels on transistors where the layer rich in the passivating element is present. The layer rich in the passivating element is removed.

An integrated circuit includes a complementary metal oxide semiconductor device having an NFET and PFET. The NFET device includes positively charged dopants at or near a transistor channel for selectively controlling a threshold voltage independently of channel doping and gate workfunction to provide for short channel control of the NFET, the PFET being free of the positively charge dopants.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
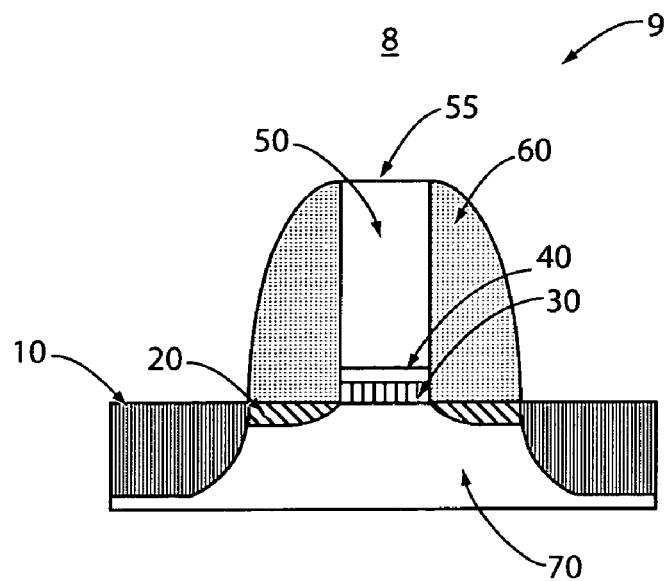
FIG. 1 is a device cross-section after amorphization of deep source/drain (S/D) and/or extension regions prior to deposition of a dielectric layer rich in hydrogen or other passivating element.

Embodiments described herein provide devices and methods for controlling a threshold voltage of a fully silicided (FUSI) or metal-gate dielectric constant (hi-K) field effect transistor (FET) independent of channel doping and metal or FUSI workfunction. In accordance with these embodiments, methods for selectively placing charge (e.g., positive charge) into an oxy-nitride portion of a FET gate stack is provided for the purpose of shifting the threshold voltage to an optimum value for short channel length control. The process is preferably selective, and is achievable using conventional processing techniques.

Methods for selectively placing positive charge into a gate stack will illustratively be described. The gate stack may include an oxy-nitride portion, which separates gate material for a gate electrode from a channel of a FET. The positive charge in the gate stack dielectric adjacent to the channel advantageously shifts the threshold voltage to an optimum value for short channel length control.

Embodiments of the present invention can take the form of a hardware embodiment in the form of an integrated circuit on a chip or on a printed wiring board. Embodiments may be included in memory devices, processors or any other integrated circuit chip. The circuit described herein may be part of the design for an integrated circuit chip. The chip design may be created in a graphical computer programming language, and stored in a computer storage medium (such as a disk, tape, physical hard drive, or virtual hard drive such as in a storage access network).

If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a cross-sectional view of an integrated circuit device 8 includes transistors 9 is illustratively shown in accordance with one exemplary embodiment. A gate stack 55 includes a gate electrode 50 formation in a CMOS process flow is followed by halo implants, and extension implants. The gate conductor 50 may include, e.g., a fully silicided (FUSI) poly gate on high-k dielectric layer (high-k dielectric may be included in e.g., layer 40 as shown in FIG. 1), a fully silicided (FUSI) poly gate on a $SiO_xN_y$ gate dielectric (e.g., layer 30), a metal gate on a high-K dielectric (e.g., layer 40), a metal gate on $SiO_xN_y$ gate dielectric (e.g., layer 30), a polysilicon gate on $SiO_xN_y$ gate dielectric (e.g., layer 30) or any other suitable gate structure. Depending on the structure employed, one or both of layers 30 and 40 may be employed.

This is followed by formation of a final spacer 60 (e.g., formed from silicon oxide or silicon nitride) and deep source/drain (S/D) implants 10. The deep S/D 10 and/or extension regions 20 are amorphized using ion/dopant implantation. The implant species used for amorphization may include Ge, Xe, C, F but could also be the extension or deep S/D dopant, as the dopant implant is self-amorphizing.

Dopants used for amorphization may include As, P, Sb or any other n-type dopants with energies ranging from, e.g., 1 keV to 50 keV and dose varying from between about $1\times10^{14}$ $cm^{-2}$ to $1\times10^{16}$ $cm^{-2}$. The amorphization of the deep S/D regions 10 and/or extension regions 20 can be achieved using non-dopant co-implants such as Ge, F, Xe, or C with energies ranging from between about 1 keV to about 50 keV and dose varying from about $1\times10^{14}$ $cm^{-2}$ to $1\times10^{16}$ $cm^{-2}$.

FIG. 1 shows the device cross-section at this stage showing the amorphized deep S/D 10, extension regions 20, gate 50 and final spacer 60. The gate 50 can be a fully silicided poly gate, metal gate, metal/poly gate stack, a conventional poly gate or any other suitable gate material and is formed on a gate oxide stack comprising an interfacial layer 30 and a dielectric layer 40. The interfacial layer 30 may include, e.g., a silicon nitride or a silicon oxy-nitride ($SiO_xN_y$). Dielectric layer 40 may include a high-K dielectric (such as, e.g., Hafnium Oxide or Hafnium Silicate or other suitable material) or $SiO_xN_y$. It is to be understood that the embodiments may include one of layers 30 and 40 or both.

A substrate 70 may include a silicon-on-insulator (SOI), bulk Si, hybrid orientation Si or other suitable substrate materials.

Figure 2:
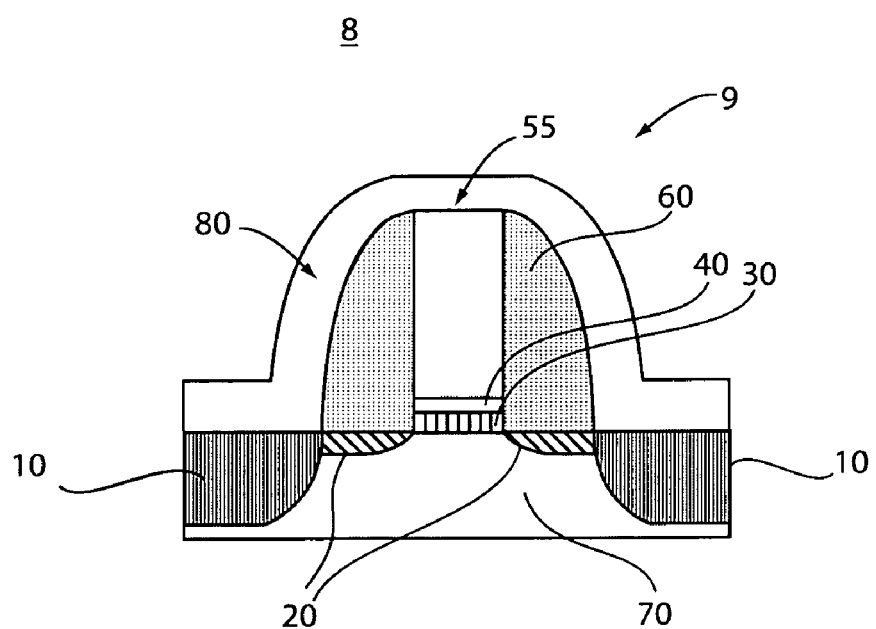
FIG. 2 is a device cross-section after deposition of the dielectric layer rich in hydrogen or other passivating element.

Referring to FIG. 2, a dielectric film rich in a passivating element 80 (such as, hydrogen) e.g., plasma enhanced chemically deposited (PECVD) SiN rich in hydrogen, is placed in physical contact with the amorphous region 10. The hydrogen-rich dielectric layer 80 may include $Si_xN_y$, $SiO_x$ or any other hydrogen rich film compatible with a high temperature front-end of line process. The hydrogen-rich dielectric layer can have a thickness ranging from about 50 angstroms to about 5000 angstroms. The dielectric hydrogen rich film 80 can then be selectively removed over the PFETs by reactive ion etching or wet etching as shown in FIG. 3.

Figure 3:
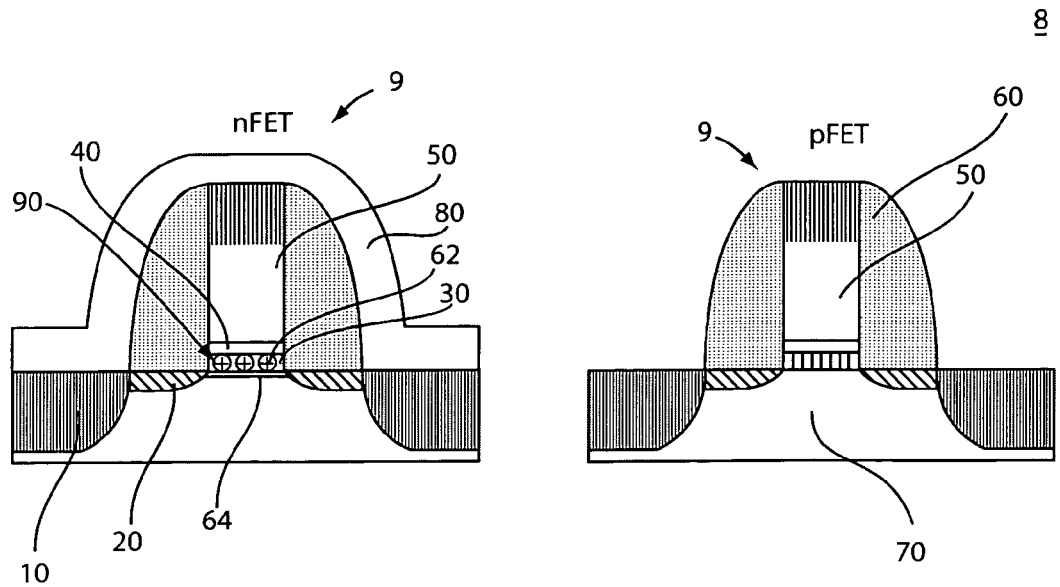
FIG. 3 shows the device cross-section of FIG. 2 after the dielectric layer rich in hydrogen or other passivating element is selectively removed from pFETs.

Referring to FIG. 3, after selectively removing the dielectric layer 80 from the PFETs, an anneal is performed which drives out the excess hydrogen or other positively charged dopants 62 from the dielectric film 80 into the interfacial layer 30 or other layer adjacent to a transistor channel 64 of the NFETs. The anneal may include a rapid thermal anneal (RTA), a spike anneal or a furnace anneal. The temperature of the anneal ranges from between about 500 degrees C. to about 1400 degrees C.

The anneal results in excess hydrogen entering interfacial layer 30. The hydrogen diffuses through the spacer 60, and gate electrode 50. Some of the hydrogen settles in the interfacial layer 30. One skilled in the art would understand that the concentration of hydrogen in the dielectric layer 80, the material selection of the dielectric film 80, spacer 60 and gate electrode 50, and the temperature selected for the annealing process will affect the concentration of the hydrogen present in interfacial layer 30. The hydrogen provides a net positive charge in the oxy-nitride base layer film 30 of the hi-K stack and the positive charge remains at or near a transistor channel 64 of the NFET device.

Figure 4:
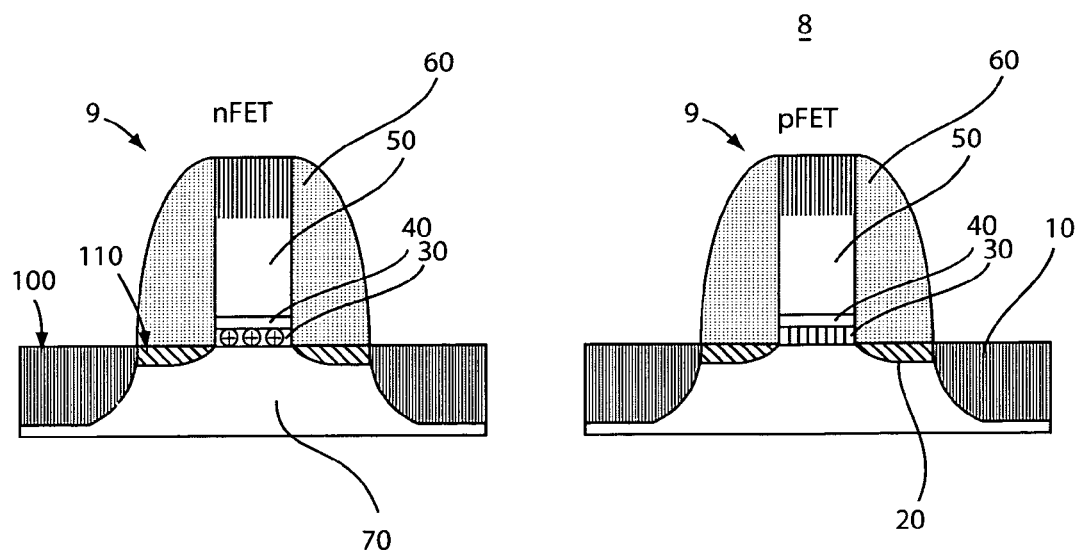
FIG. 4 shows a device cross-section after complete removal of the dielectric layer rich in hydrogen or other passivating element.

Referring to FIG. 4, the anneal process also recrystallizes the source/drain regions 100 and extension regions 110. It is preferable to get an acceptable carrier mobility when using a hi-K gate dielectric. An interfacial oxy-nitride layer 30 is usually needed and preferred. The disclosed process is also selective to a particular FET (i.e., NFET only) as the hydrogen rich film may be etched away from FETs where this positive charge is not desired (i.e. PFETs). The impact of the positive charge is to lower the base threshold voltage of NFETs, which permits a strong halo dose to be used in setting Vt. A strong halo dose is essential to control short channel effects in deep sub-micron FETs, although improvements are obtained by lesser dosages.

The ability to keep this charge out of the PFET is also an important aspect, and permitted by present embodiments. Halo implantation provides dopant implants into a substrate. Halo implantation processes are known in the art. After the thermal drive in process, the dielectric film 80 may be removed as shown in FIG. 4. The hydrogen-rich layer 80 can be removed by, e.g., using a reactive ion etc (RIE) or wet-etch process. All other CMOS processing may proceed as currently practiced in the art.

Devices and methods for selectively controlling the NFET threshold voltage independently of channel doping and gate workfunction has been illustratively described. This enables optimization of a channel doping profile for short channel control while achieving a desired threshold voltage without affecting performance of the PFET device. This offers significant advantages in device performance. While the embodiments have been described in an illustrative manner, it is to be appreciated that those skilled in the art will readily apply these teachings to other possible variations, e.g., introducing negative charge instead of positive charge, etc.

Having described preferred embodiments of selective incorporation of charge for transistor channels (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for selective placement of charge into a gate stack comprising:
   forming gate stacks including a gate dielectric adjacent to a transistor channel and a gate conductor;
   forming doped regions for transistor operation;

depositing a layer rich in a passivating element over the doped regions and the gate stack;

removing the layer rich the passivating element from selected transistors;

annealing the layer rich in the passivating element to drive-in the passivating element to increase a concentration of charge at or near transistor channels on transistors covered by the layer rich in the passivating element; and removing the layer rich in the passivating element.

2. The method as recited in claim 1, wherein forming gate stacks includes forming one of a fully silicided (FUSI) poly gate on high-K dielectric, a fully silicided (FUSI) poly gate on a $SiO_xN_y$ gate dielectric, a metal gate on high-K dielectric, a metal gate on $SiO_xN_y$ gate dielectric and a poly gate on $SiO_xN_y$ gate dielectric.

3. The method as recited in claim 1, wherein the gate dielectric includes an oxy-nitride layer.

4. The method as recited in claim 1, wherein forming doped regions for transistor operation includes performing non-dopant co-implants.

5. The method as recited in claim 1, wherein depositing a layer rich in a passivating element over the doped regions and the gate stack includes depositing a hydrogen rich dielectric layer.

6. The method as recited in claim 5, wherein the gate stacks are employed for complementary metal oxide semiconductor (CMOS) devices and the selected devices include p-doped field effect transistors (PFETs).

7. The method as recited in claim 1, wherein the layer rich in the passivating element includes $Si_xN_y$ or $SiO_x$.

8. The method as recited in claim 1, wherein annealing the layer rich in the passivating element to drive-in the passivating element to increase a concentration of charge at or near transistor channels of the selected devices includes applying an additional positive charge to only n-doped field effect transistor (NFET) device channels of complementary metal oxide semiconductor (CMOS) devices.

9. The method as recited in claim 1, wherein annealing the layer includes setting a threshold voltage using the passivating element from the layer rich in the passivating element.

10. A method for placing charge into a field effect transistor (FET) gate stack for complementary metal oxide semiconductor (CMOS) devices, comprising:

patterning of a gate stack including a gate dielectric layer;

amorphizing at least one of source and drain diffusion regions and extension diffusion regions in a substrate;

depositing a hydrogen-rich dielectric layer;

removing the hydrogen-rich layer over p-doped field effect transistors (PFETs);

annealing the hydrogen rich layer to drive-in dopants to increase a concentration of positive charge at or near transistor channels of n-doped field effect transistors (NFETs); and removing the hydrogen rich layer.

11. The method as recited in claim 10, wherein patterning gate stacks includes forming one of a fully silicided (FUSI) poly gate on high-K dielectric, a fully silicided (FUSI) poly gate on a $SiO_xN_y$ gate dielectric, a metal gate on high-K dielectric, a metal gate on $SiO_xN_y$ gate dielectric and a poly gate on $SiO_xN_y$ gate dielectric.

12. The method as recited in claim 10, wherein the gate dielectric includes an oxy-nitride layer.

13. The method as recited in claim 10, wherein amorphizing includes performing non-dopant co-implants.

14. The method as recited in claim 10, wherein the hydrogen rich layer includes $Si_xN_y$ or $SiO_x$.

15. The method as recited in claim 10, wherein annealing the layer rich in hydrogen or passivating element to drive-in dopants to increase a concentration of charge at or near transistor channels of the selected devices includes applying an additional positive charge to only n-doped field effect transistor (NFET) device channels of complementary metal oxide semiconductor (CMOS) devices.

16. The method as recited in claim 10, wherein annealing the hydrogen rich layer to drive-in dopants to increase a concentration of positive charge at or near transistor channels of n-doped field effect transistors (NFETs) includes setting a threshold voltage by using hydrogen from the hydrogen rich layer.

* * * * *